June 23, 1970 J. RECH 3,516,141

MACHINE FOR ASSEMBLING ELECTRONIC COMPONENTS
WITH PRINTED CIRCUIT BOARDS

Filed Jan. 8, 1968 4 Sheets-Sheet 1

INVENTOR.
JAKOB RECH.
BY
Wallace P. Lamb
ATTORNEY.

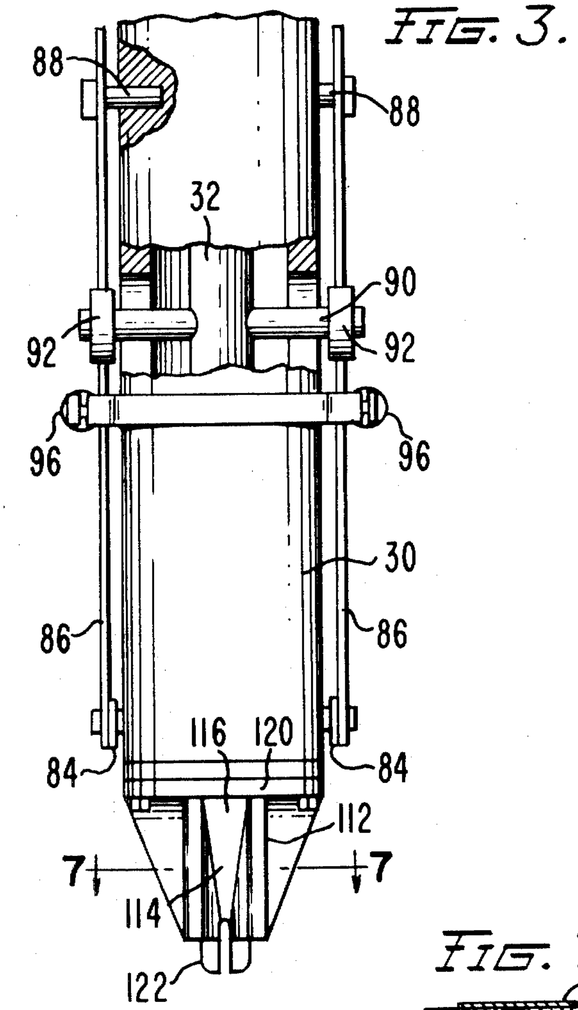
FIG. 4.
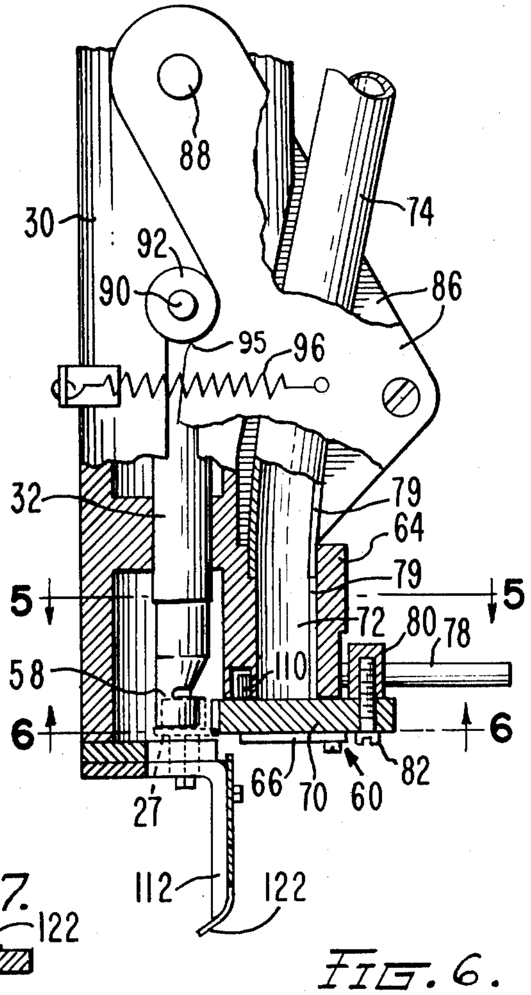
FIG. 7.
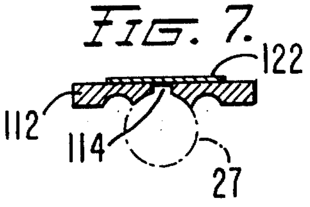
FIG. 6.
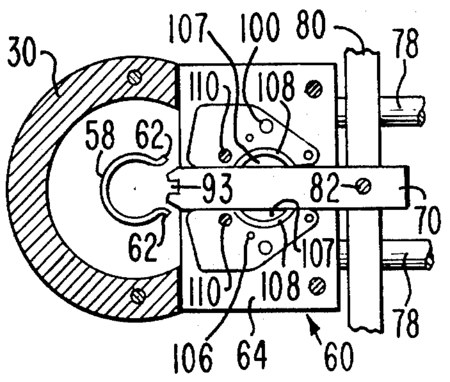
FIG. 5.
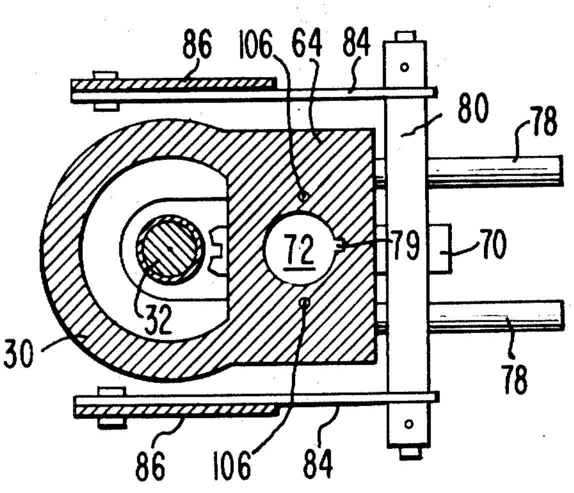
INVENTOR.
JAKOB RECH.
BY
Wallace P. Lamb
ATTORNEY.

June 23, 1970 J. RECH 3,516,141

MACHINE FOR ASSEMBLING ELECTRONIC COMPONENTS WITH PRINTED CIRCUIT BOARDS

Filed Jan. 8, 1968 4 Sheets-Sheet 3

INVENTOR.

JAKOB RECH.

BY

ATTORNEY.

INVENTOR.
JAKOB RECH.
BY
[signature]
ATTORNEY.

United States Patent Office 3,516,141
Patented June 23, 1970

3,516,141

MACHINE FOR ASSEMBLING ELECTRONIC COMPONENTS WITH PRINTED CIRCUIT BOARDS

Jakob Rech, Detroit, Mich., assignor to Burroughs Corporation, Detroit, Mich., a corporation of Michigan Filed Jan. 8, 1968, Ser. No. 696,233
Int. Cl. H05k *13/00;* B23q *7/10*
U.S. Cl. 29—203 9 Claims

ABSTRACT OF THE DISCLOSURE

An assembling machine for delivering transistors singly to a vertically movable transistor holder which is movable downwardly from a retracted position to insert electrical leads of the transistor into designated holes of a printed circuit board. A stack of transistors disposed laterally of the holder, is biased downwardly by gravity and is in communication with a horizontal passage which is aligned with the holder when the holder is in a retracted position. Transistors are dispensed from the stack by a horizontal reciprocal pusher in the passage which allows the lowermost transistor to drop down and then be pushed along the passage into the holder. Between the pusher and the holder a pair of yieldable guide members, operated by the pusher, function to locate and steady a transistor as the transistor is being mover along the passage to the holder, thus making it possible to feed the transistor directly to the holder by the pusher which also functions as the transistor dispenser control member.

SUMMARY OF THE INVENTION

The invention resides in the provision of a resilient socket type of holder on the inserter head adapted to having a transistor placed therein by a side insertion operation of the dispenser-pusher. Further, the invention embraces the provision of a pair of yieldable members in a horizontal transistor passage between the transistor dispenser and the resilient socket to guide and steady a transistor being pushed along the passage to the socket.

IN THE DRAWINGS

FIG. 3 is an enlarged fragmentary elevational view of the inserter head, taken in the direction of the arrows 3—3 of FIG. 1;

FIG. 4 is a side view partly broken away and in section of the inserter head of FIG. 3;

FIG. 5 is a horizontal sectional view, taken along the line 5—5 of FIG. 4;

FIG. 6 is another horizontal sectional view, taken along the line 6—6 of FIG. 4;

FIG. 7 is another horizontal sectional view, taken along the line 7—7 of FIG. 3;

Figures 1, 2:
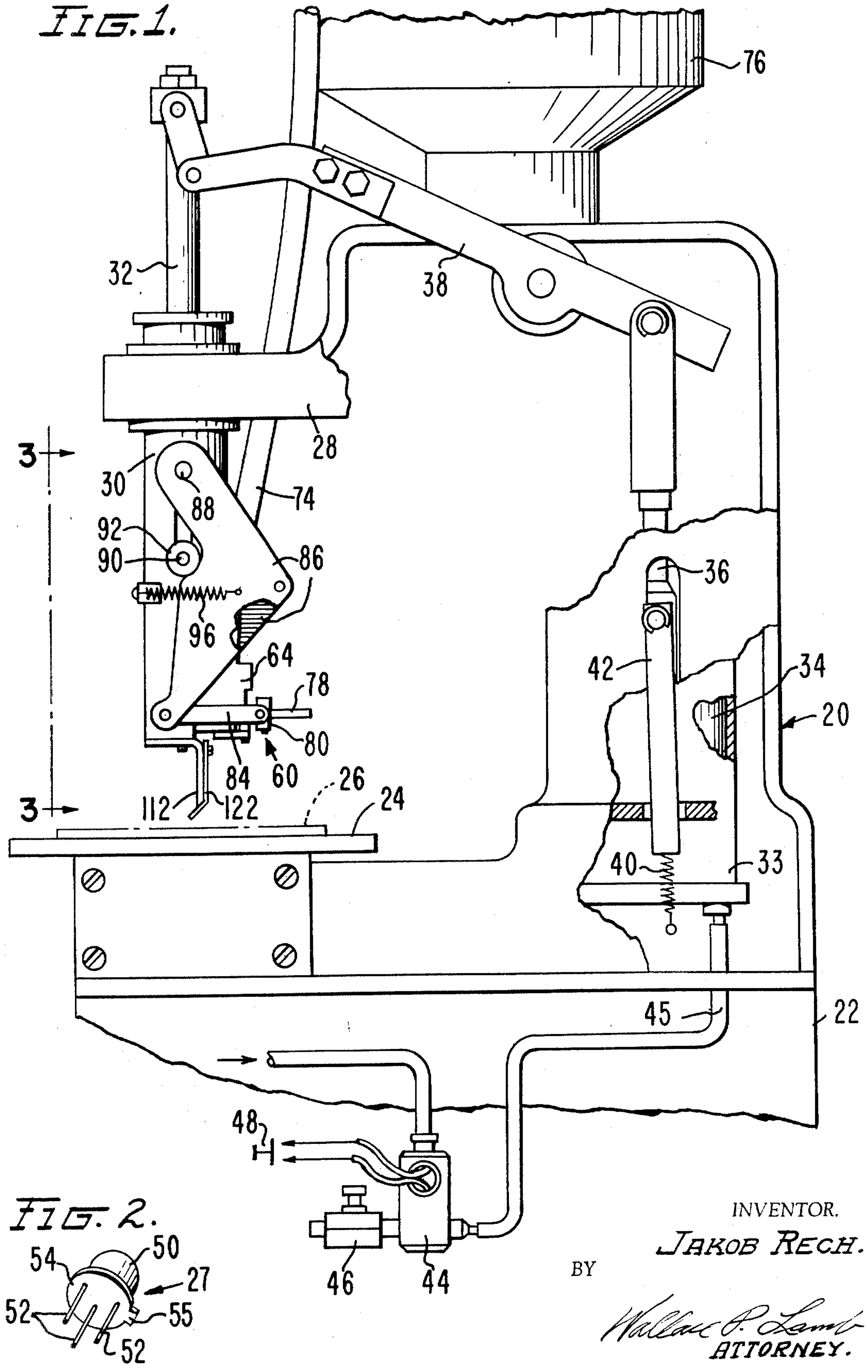
FIG. 1 is a fragmentary side view of an assembling machine partly broken away and in section, embodying features of the invention.
FIG. 2 is a perspective view of one of the transistors.

Referring to the drawings by characters of reference, the machine includes a standard 20 having a base 22 on which a raised bed plate 24 is provided to support a circuit board 26. The circuit board 26 has performed holes to receive the leads respectively of a transistor 27, shown in FIG. 2. Above the base 22, a horizontal arm 28 of the standard 22 overlies the bed plate 24 and supports a guide sleeve 30 for slideably guiding a vertically movable transistor inserter or head 32. Any suitable power element may be used to operate the head 32, such as an air cylinder 33 and piston 34, the latter being connectable by linkage including a rod 36 and a lever 38 to the head. A pair of springs 40, of which only one is shown, are connected to the rod 36 by links 42 and function to return the head 32 to its upper or retracted position, shown in FIGS. 1, 3, and 4. A solenoid valve 44, in communication with a source of pressurized air, controls operation of the piston 34 and is connected by a conduit 45 to the cylinder 33. The numeral 46 designates the well known air vent or bleed commonly employed with solenoid valves used with air pressure systems. An electrical switch 48 connected to the solenoid of the control valve 44 is operable to initiate a cycle of operation of the machine. For a more detailed description of the control system, reference may be had to the patent to Lawrence E. Mueller, No. 3,025,593, which issued Mar. 20, 1962 for "Applicator for Applying Components to Printed Circuit Boards."

The transistor 27 is a well known type, contained in a cylindrical casing 50 from one end of which electrical leads 52 project, as shown in FIG. 2. At this end of the transistor, the casing 50 is provided with an external annular flange 54 and on the periphery of the flange there is a guide tab 55 which aids in the holding and guiding of the transistor as will be hereinafter more fully understood.

In accordance with the invention, the head 32 is provided with and carries a holder 58 to receive a transistor 27 from a feed device, designated in general by the reference character 60. The holder 58 is a resilient spring socket which generally is of tubular shape having an opening at one side thereof defined by outwardly flared end portions 62. An upper tube portion of the holder 58 is fitted and secured onto the head 32 which is in the form of a quill or shaft, as shown. The diameter of the tubular shaped socket is about the same diameter as, or slightly less than, the diameter of the transistor casing 50. The distance between the end portions 62 of the spring socket 58 is slightly less than the inside diameter of the socket, requiring that said portions 62 be displaced outwardly by the transistor casing to allow the latter to pass into the socket.

Figure 12:
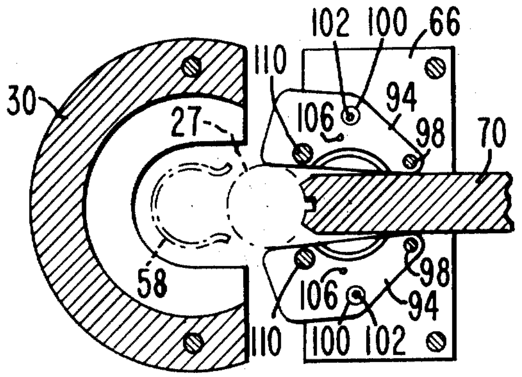
Figure 13:
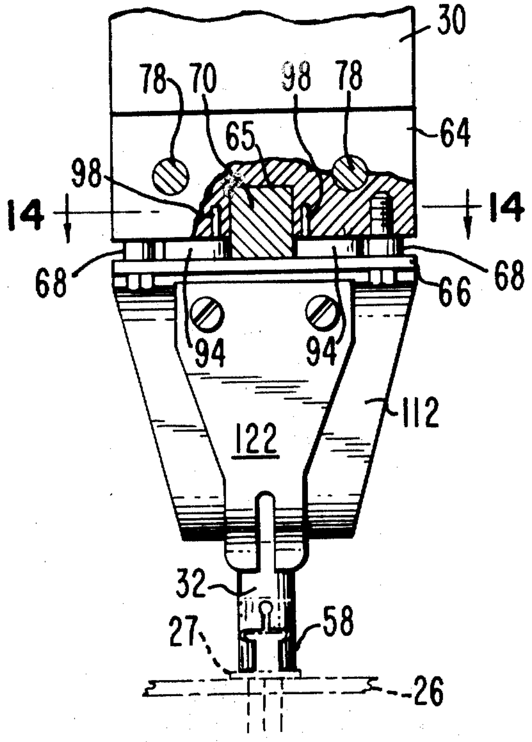
FIG. 13 is an elevational view partly broken away and in section, taken along the line 13—13 of FIG. 8.

The transistor feed device 60 is mounted on the sleeve 30, and includes a body 64 which may be integral therewith, as shown. The body 64 has a horizontal channel 65 provided in the flat underside thereof and the channel intersects the sleeve 30 substantially in alignment with the socket 58, as best seen in FIG. 12. A plate 66, attached to the underside of the body 64, and spaced therefrom by suitable spacers 68, cooperates with the channel 65 to define a horizontal passage 69 along which a transistor is conveyed to the holder 58 by a horizontal pusher 70 which is reciprocal within the passage on the plate 66. An upper transistor inlet passage 72 to the body 64 is connected by a conduit 74 to the outlet of a hopper 76 which is mounted on top of the standard 20. The hopper 76 may be of any suitable type, such as a vibratable hopper operable to maintain a column of transistors with the lowermost one of the transistors normally resting on the pusher 70. which in addition to feeding a transistor to the holder 58, also controls the inlet 72 to the horizontal pathway 69 and thus constitutes a dispenser. A guide slot 79 in the wall of the conduit 74 and in the body 64 receives the tab 55 of a transistor and extends down to the inlet 72 to prevent rotation of the transistor as the latter moves downwardly.

Figure 8:
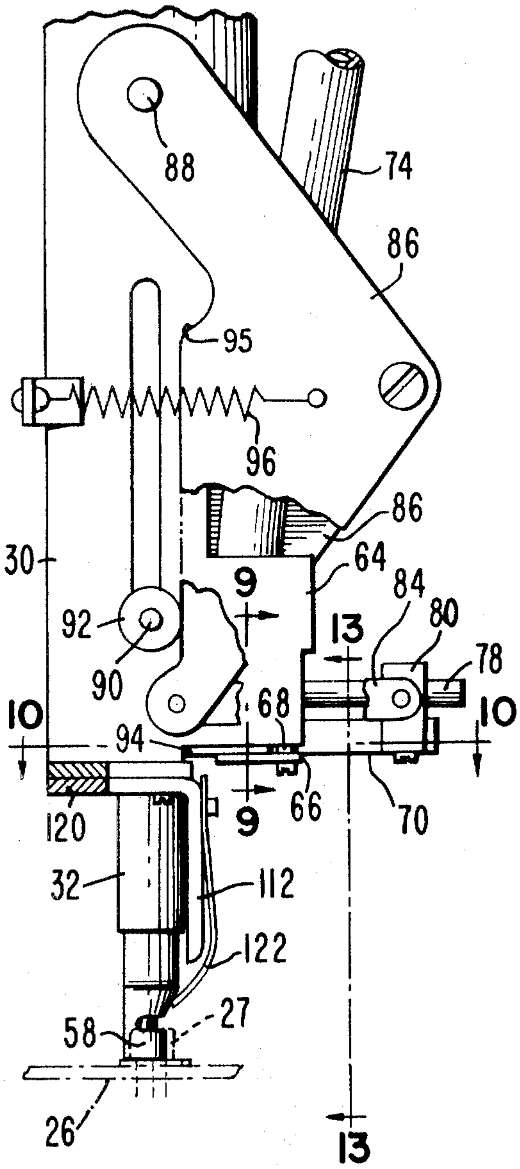
FIG. 8 is a side view of the inserter head, similar to FIG. 4, but with the operating parts shown in the positions they assume at the completion of the compartment insertion stroke.

Affixed to the body 64 and extending parallel to the pusher 70 there is a pair of horizontal guide pins 78 on which a cross bar 80 is slideably guided, the bar being connected to the pusher 70 by a screw 82. The outer ends of the bar 80 are connected pivotally by links 84 to the lower free ends 85 respectively of a pair of levers 86 which are pivoted, adjacent their upper ends, as at 88, to the stationary sleeve 30. As is shown more clearly in FIG. 3 a rod 90 extends transversely through and is affixed to the head 32, and on each end of the rod 90 there is a cam follower or roller 92 which engage cams 95 provided on edges of the levers 86. A pair of springs 96 urge the levers 86 in a direction to maintain the cams 94 in engagement with the cam followers 92. When the head 30 moves downwardly to insert the leads of a component 27 into the circuit board 26, the cam followers 92 pivot the levers 86 counterclockwise, as viewed in FIGS. 1, 4, and 8, which retracts the pusher 70 sufficiently to open the inlet 72 whereupon the next transistor drops down into the passage ahead of the pusher 70. The forward end of the pusher 70 is preferably concave and complementary to the cylindrical casing of the transistor and has a slot 93 to receive the tab 55 so as to hold the transistor against rotation as the transistor is being fed to the holder 58.

Figure 10:
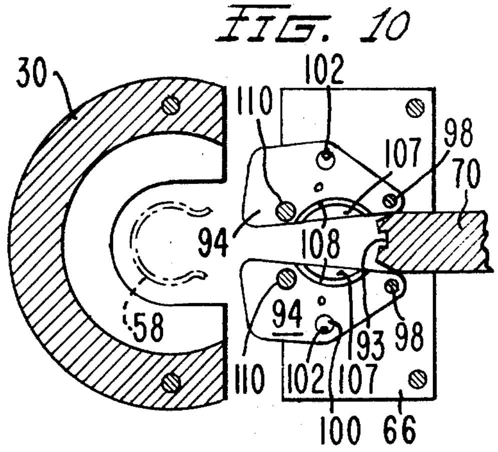
FIG. 10 is a horizontal sectional view, taken along the line 10—10 of FIG. 8 showing the positions that certain parts assume at completion of the component insertion stroke.

In order to guide and otherwise handle a transistor so that it will have stability as it is being moved along the pathway 69 of the feeder 60, I provide a pair of yieldable holding members 94 oppositely disposed along opposite sides of the channel 65 to engage the transistor casing 54. The holders 94 are preferably made of a suitable sheet material which may be metal, the holders being coplanar and in broadside parallelism to the underside of the body 64. Adjacent to what may be termed their rear ends with respect to the direction of travel of the transistor, the holders 94 are individually pivoted to the body 64 by a pin 98 which may be affixed in and to the holder. Each of the holders 94 is provided with a hole 100 and affixed to the body 64 are stop pins 102 which respectively project into the holes 100 which, as shown, are larger than the pins 102 so as to limit pivoting of the holders 94 toward each other. Further, the holders 94 are provided each with another hole 104 into which projects and is secured a wire spring 106 which bias the free ends of the holders toward each other into the path of travel of the transistors, as illustrated in FIG. 10.

Figure 9:
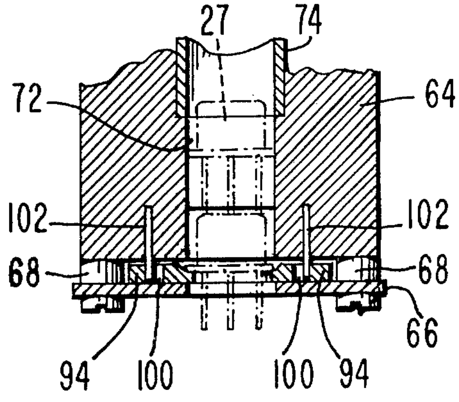
FIG. 9 is a fragmentary enlarged vertical sectional view, taken along the line 9—9 of FIG. 8.
Figure 11:
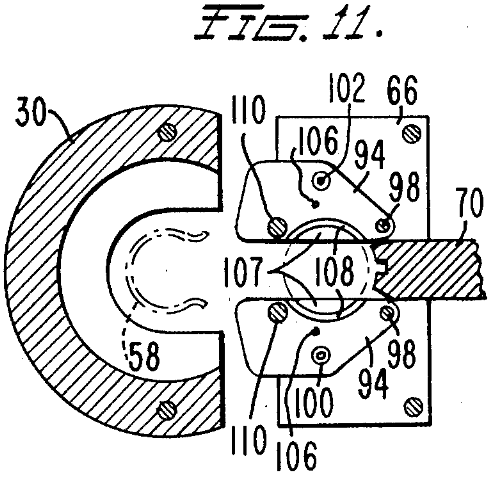
FIGS. 11 and 12 are views similar to FIG. 10 illustrating the handling and feeding of a component to the inserter head.

In their upper faces, each of the holders 94 is provided with a recessed seat 107, the seats being coplanar and intersecting the opposed side edges of the holders so as to be arcuate as seen in plan. The arcuate seats 107 from segments of a circle when the holders 94 are pivoted away from each other to the positions shown in FIG. 11, and the diameter of the circle is substantially equal to the diameter of the flange 54 of the transistor casing 50. The circle with which the seat arcs are coincident in FIG. 11 is directly below or in registry with the inlet 72. Extending around each of the seats, an arcuate cam 108 is provided, the cam having a conical segment extending upwardly and outwardly from the seat, as best shown in FIG. 9.

Figure 14:
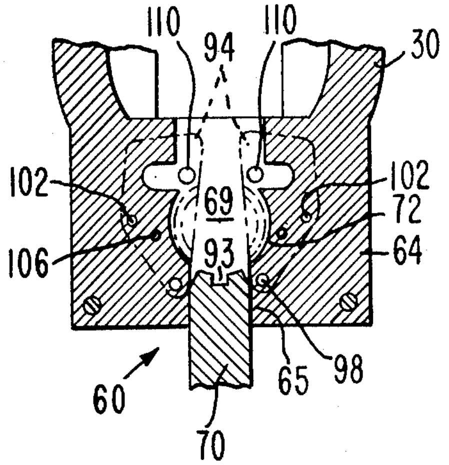
FIG. 14 is a horizontal sectional view taken along the line 14—14 of FIG. 13.

In order to guide a component 27 down in its biased descent from the inlet 72, I provide a pair of oppositely disposed guide members or pins 110 affixed respectively onto the holders 94 between the seats 107 and the spring holder 58. The guide pins 110 are located near the opposed side edges of the holders 94 and adjacent the seats 107 such that when the holders are allowed to pivot toward each other to the position shown in FIG. 14, the pins move out into the path of travel 69. In these positions, the guide pins 110 project into the intersection of the vertical inlet passage 72 with the horizontal channel 65 and function to guide a transistor down onto the seat cams 108.

Mounted on the lower end of the sleeve 30 there is a guide member 112 having a guideway 114 to receive the tab 55 of a transistor to insure that the leads thereof will register with the holes in the circuit board 26. To insure that the tab 55 will enter the guideway 114, the latter is tapered from a large inlet, as shown at 116 in FIG. 3 to a restricting outlet 118 at the bottom of the guideway 114. The guide member 112 is the vertical leg of an angle bracket of which the horizontal leg 120 is secured to the underside of the guide sleeve 30. The numeral 122 designates a stripper element to strip the inserter 32 of a transistor on the "up" stroke of the inserter.

OPERATION

Figure 15:
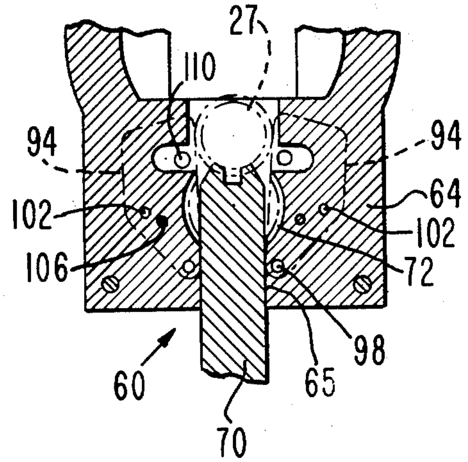
FIG. 15 is a view similar to FIG. 14.
Figure 16:
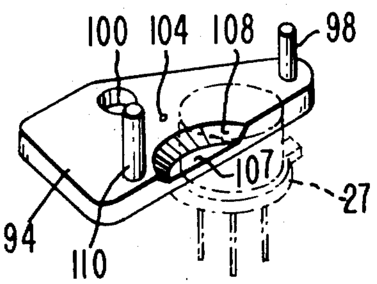
FIG. 16 is a perspective view.

Normally, the inserter 32 is in its raised or retracted position shown in FIG. 4 and the pusher 70 is in a corresponding forward position where it stops when the inserter reaches its retracted position. As shown in dot and dash lines, a transistor has been placed in the spring socket 58 on the inserter 32 and the tab 55 of the transistor flange 54 is held by the pusher slot 93 in registry with the vertical slot 114 of the guide member 112. When the machine attendant closes the switch 48 of FIG. 1, the piston 34 is forced upwardly and through the linkage, including the rod 36 and the lever 38, moves the head 32 downward to insert the transistor leads into the board 26. As the inserter head 32 moves downwradly, the pair of cam followers 92, carried by the head, pivot the levers 86 and through the connecting links 84 retract the pusher 70 which reaches its fully retracted position at the end of the down stroke of the inserter 32. When the pusher 70 approaches its fully retracted position, the wire springs 106 are free to pivot the holders 94 toward each other to the positions shown in FIGS. 10 and 14 in which the guide pins 110 are moved closer to the transistor inlet passage 72. As the pusher 70 reaches its fully retracted position it clears or fully opens the inlet 72 whereby the lowermost transistor of the column is biased downwardly onto the cams 108, the tab 55 of the transistor casing engaging in the slot 93 in the adjacent end of the pusher. At this point it should be noted with reference to FIG. 14, for example, that the front end of the pusher 70, the arcuate wall of the inlet passage and the pins 110 cooperate to provide a retainer for a transistor dropping down onto the cams 108. The weight of the transistor acting on the cams 108 pivots the holders 94 slightly apart from each other and, at about the same time, the pusher 70 starts forward to push the transistor into the spring socket 58. The pusher, advancing the transistor toward the spring socket 58, further spreads the holders 94 apart as illustrated in FIGS. 12 and 15, the wire springs 106 being further tensioned to force the holders 94 against the periphery of the transistor flange 54 as the transistor is being pushed into the spring socket 58, the pusher coming to rest, as shown in FIG. 4. Thus, for each inserting operation of the inserter 32, the feed device pusher 70 is operated to dispense and place another transistor in the spring socket 58.

What is claimed is:

1. In an assembling machine for transporting electronic components singly to and assembling them with a printed circuit board, a vertically movable component holding socket having a side insertion opening and having a raised retracted position, said component holding socket movable downwradly to insert electrical leads of a component into holes of a printed circuit board, means defining a horizontally extending component passage having an outlet in alignment with the opening of said component holding socket when said component holding socket is in its raised retracted position, said passage having an upper inlet in communication with the bottom of a stack of components and intersecting said passage, and a reciprocal pusher within said passage movable to a position to open said inlet, said reciprocal pusher operatively connected to said component holding socket to dispense a component on the downward stroke of said holding socket and push the dispensed component along said passage into said holding socket on the upward stroke of said holding socket.

2. In an assembling machine as defined by claim 1 wherein said holding socket is resilient.

3. In an assembling machine as defined by claim 2 wherein said holding socket has outwardly flared oppositely disposed end portions defining a component receiving pilot facing said pusher when said holding socket is in raised position.

4. In an assembling machine as defined by claim 1 with the addition of a pair of yieldable component holding members mounted on said passage defining means on opposite sides respectively of said passage and between said inlet and said outlet, said component holding members biased toward each other into said passage and being spread apart out of said passage by said pusher during the component pushing stroke of said pusher.

5. In an assembling machine as defined by claim 4, the addition of a pair of recessed upwardly facing seat portions respectively on said holding members beneath said inlet to receive a component.

6. In an assembling machine as defined by claim 5 in which said seat portions are arcuate segments.

7. In an assembling machine as defined by claim 6 with the addition of arcuate cams flared upwardly respectively from said seats to receive and guide a component descending from said inlet.

8. In an assembling machine as defined by claim 7 with the addition of a pair of guide members carried respectively by said pair of holding members within said passage to guide downward movement of a component to said seat portions.

9. In an assembling machine as defined by claim 8 wherein said guide members are upstanding pins.

References Cited

UNITED STATES PATENTS

| | | | |
|---|---|---|---|
| 2,901,127 | 8/1959 | Hazel | 214—1 |
| 2,914,843 | 12/1959 | Petersen. | |
| 2,906,010 | 9/1959 | Hannable. | |
| 3,025,593 | 3/1962 | Mueller | 29—211 X |

THOMAS H. EAGER, Primary Examiner

U.S. Cl. X.R.

29—211